(12) United States Patent
Noh et al.

(10) Patent No.: US 8,075,693 B2
(45) Date of Patent: Dec. 13, 2011

(54) CRUCIBLE HEATING APPARATUS AND DEPOSITION APPARATUS INCLUDING THE SAME

(75) Inventors: Sok-Won Noh, Suwon-si (KR);
Tae-Min Kang, Suwon-si (KR);
Jin-Wook Seong, Suwon-si (KR);
Sang-Bong Lee, Suwon-si (KR);
Seung-Mook Lee, Suwon-si (KR);
Jin-Woo Park, Suwon-si (KR);
Sun-Hoe Kim, Suwon-si (KR);
Myung-Jong Jung, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 684 days.

(21) Appl. No.: 12/196,603

(22) Filed: Aug. 22, 2008

(65) Prior Publication Data

US 2009/0050053 A1    Feb. 26, 2009

(30) Foreign Application Priority Data

Aug. 23, 2007    (KR) .................. 10-2007-0084933

(51) Int. Cl.
*C23C 16/00*    (2006.01)
(52) U.S. Cl. ........................................ 118/726; 118/727
(58) Field of Classification Search .................. 118/726
See application file for complete search history.

(56) References Cited

U.S. PATENT DOCUMENTS

| | | | |
|---|---|---|---|
| 4,377,339 A | | 3/1983 | Coppock |
| 4,426,569 A | | 1/1984 | Miller et al. |
| 4,553,022 A | * | 11/1985 | Colombo ..................... 392/388 |
| 5,315,091 A | * | 5/1994 | O'Brien et al. ............... 219/385 |
| 6,881,271 B2 | | 4/2005 | Ochiai et al. |
| 2004/0035366 A1 | | 2/2004 | Keum et al. |
| 2005/0034810 A1 | * | 2/2005 | Yamazaki et al. ......... 156/345.3 |
| 2006/0096542 A1 | | 5/2006 | Ryu et al. |

FOREIGN PATENT DOCUMENTS

| | | |
|---|---|---|
| CN | 1478918 | 3/2004 |
| JP | 55-122870 | 9/1980 |
| JP | 62-160460 | 7/1987 |
| JP | 6-56577 | 3/1994 |
| JP | 10-59797 | 3/1998 |
| JP | 11-222667 | 8/1999 |
| JP | 2004-353084 | 12/2004 |
| JP | 2005-206914 | 8/2005 |
| JP | 2006-111961 A | 4/2006 |
| KR | 2004-9349 | 1/2004 |
| KR | 2006-40828 | 5/2006 |

OTHER PUBLICATIONS

English translation JP 11-222667, Negishi, Aug. 1999.*
Korean Notice of Allowance issued on Sep. 9, 2009 in the corresponding Korean Patent Application No. 10-2007-0084933.

* cited by examiner

*Primary Examiner* — Keath Chen
(74) *Attorney, Agent, or Firm* — Christie, Parker & Hale, LLP

(57) ABSTRACT

A crucible heating apparatus and a deposition apparatus including the same. The crucible heating apparatus includes: a crucible including a main body to house a deposition material, and a cover disposed on the main body, having a nozzle; a band coupled to the crucible, through contact parts; a thermocouple coupled to the band; a housing to house the crucible and the band; and a heater disposed inside the housing, to heat the deposition material.

20 Claims, 2 Drawing Sheets

CRUCIBLE HEATING APPARATUS AND DEPOSITION APPARATUS INCLUDING THE SAME

CROSS-REFERENCE TO RELATED APPLICATIONS

This application claims the benefit of Korean Application No. 2007-84933, filed Aug. 23, 2007, the disclosure of which is hereby incorporated herein by reference.

BACKGROUND

1. Field of the Invention

Aspects of the present invention relate to a crucible heating apparatus, and a deposition apparatus including the same, and more particularly, to a crucible heating apparatus including a band having contact parts, and a deposition apparatus including the same.

2. Description of the Related Art

Recently, research on implementing large displays, and improving the quality of the displays, has been widely performed, utilizing the advantages of thin and lightweight structures of Flat Panel Displays (FPDs), such as Liquid Crystal Displays (LCDs), and Organic Light Emitting Diodes (OLEDs). Among the FPDs, the OLED may be a next generation FPD capable of providing rapid response speed, enabling color representation without a color filter, and solving problems of conventional OLEDs, without using a separate light source.

Generally, an OLED has a predetermined pattern of pixel electrodes formed on a substrate. Organic layers, such as a hole transport layer, an organic emission layer, an electron transport layer, and so on, are sequentially formed on the pixel layer, and an opposite electrode is formed on the organic layers.

Organic layers of an OLED may be formed by photolithography. However, during photolithography, the organic layers can be exposed to moisture during a resist delamination process, and an etching process. The moisture can cause problems when depositing an organic layer.

In order to solve the above problems, a method of evaporating, sublimating, and vacuum depositing an organic material in a vacuum chamber may be performed, to form the organic layers. Such a vacuum deposition method includes positioning a substrate, on which an organic layer is to be formed, in the vacuum chamber. Then, a pattern mask, including a plurality of pattern parts, is disposed under the substrate. At this time, a crucible heating apparatus, containing an organic material for deposition on the substrate, is disposed under the pattern mask at a predetermined distance.

The crucible heating apparatus evaporates the organic material, which has the pattern of the pattern mask, using a heater, to form an organic layer on the substrate. Therefore, the crucible heating apparatus is an important apparatus that exerts a direct influence on characteristics of the organic layer.

A conventional crucible heating apparatus includes a crucible that includes a main body having an open upper part, to contain a material to be deposited, and a cover coupled to the upper part of the main body, having an opening for ejecting the material. A temperature control part is disposed at the exterior of the crucible heating apparatus, to control a temperature thereof. The temperature control part is electrically connected to the main body, by a thermocouple. Therefore, since a temperature of the deposition material contained in the main body can be obtained by the thermocouple, it is possible to control the deposition of the material, by adjusting a heater that heats the crucible.

In the conventional crucible heating apparatus, the thermocouple and the main body of the crucible are in point contact with each other. For this reason, when the thermocouple is attached or detached, to perform maintenance on the crucible, or to exchange the deposition material, it is difficult to contact the thermocouple with the main body, at the same position. Therefore, it is difficult to reproduce the same temperatures.

On the other hand, a non-contact thermocouple can be connected to a band spaced a certain distance from the exterior of the main body, without being directly connected to the main body. Therefore, temperatures of the heater and the deposition material may both be detected, such that a temperature higher than the actual temperature of the deposition material is detected, thereby causing problems in the accuracy of the temperature.

SUMMARY

Aspects of the present invention provide a crucible heating apparatus, and a deposition apparatus including the same, which are capable of improving temperature precision and temperature accuracy, by including a band having contact parts.

According to aspects of the present invention, a crucible heating apparatus includes: a crucible including a main body to house a deposition material, and a cover disposed on the main body, having a nozzle; a band coupled to an outer lower region of the crucible, through a plurality of contact parts, and connected to one terminal of a thermocouple; a housing to house the crucible and the band, having an open upper part; and a heater disposed inside the housing, to heat the deposition material.

According to another aspect of the present invention, a deposition apparatus includes: a chamber; a pattern mask disposed in an upper part of the chamber, having a plurality of pattern parts; and a crucible heating apparatus, including a crucible including a main body to house a deposition material, and a cover disposed on the main body, having a nozzle; a band coupled to an outer lower region of the crucible, through a plurality of contact parts, and connected to one terminal of a thermocouple; a housing to house the crucible and the band, and having an open upper part; and a heater disposed inside the housing, to heat the deposition material.

Additional aspects and/or advantages of the invention will be set forth, in part in the description which follows, and in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION

Figure 1:
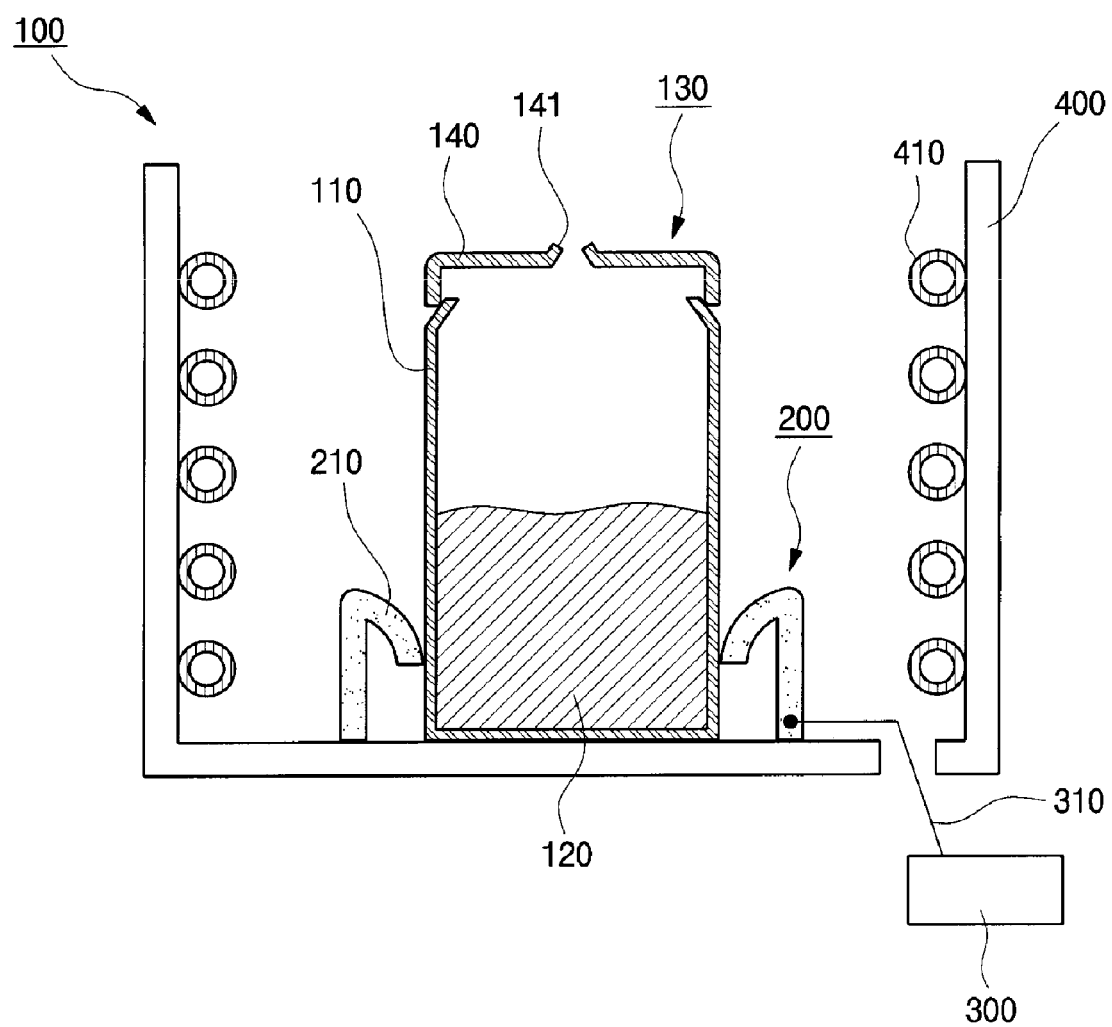
FIG. 1 is a cross-sectional view of a crucible heating apparatus, in accordance with an exemplary embodiment of the present invention.

Reference will now be made in detail to the exemplary embodiments of the present invention, examples of which are illustrated in the accompanying drawings, wherein like reference numerals refer to the like elements throughout. The embodiments are described below in order to explain the present invention by referring to the figures.

Figure 2:
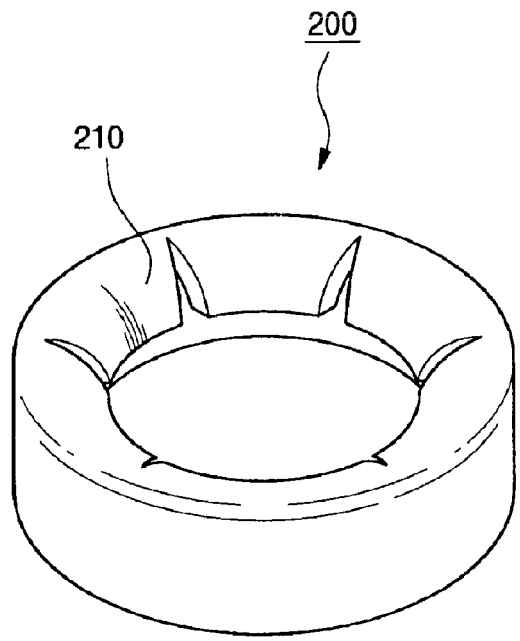
FIG. 2 is a perspective view of a band of the crucible heating apparatus, in accordance with an exemplary embodiment of the present invention.

FIG. 1 is a cross-sectional view of a crucible heating apparatus 100, in accordance with an exemplary embodiment of the present invention, and FIG. 2 is a perspective view of a band 200 of the crucible heating apparatus 100, in accordance with an exemplary embodiment of the present invention. Referring to FIGS. 1 and 2, the crucible heating apparatus 100 includes a crucible 130 to house a deposition material 120, a band 200 having contact parts 210 to secure the crucible 130, a thermocouple 310 coupled to the band 200, a heater 410 to heat the crucible 130, and a housing 400 to house the above components.

A terminal of the thermocouple 310 is connected to a lower part of the band 200, to measure the temperature of the band 200. Another terminal of the thermocouple 310 is connected to a temperature controller 300 disposed outside of the crucible heating apparatus 100. The temperature controller 300 can control the temperature of the deposition material 120, by controlling the heater 410.

The crucible 130 includes a cylindrical main body 110 that has an opening, and a cover 140 to cover the opening. The deposition material 120 is disposed in the main body 110. The deposition material 120 may be any suitable evaporable material, such as any generally used organic deposition material.

A nozzle 141 is installed in the center of the cover 140, to discharge the deposition material 120. The crucible 130 may be formed of any suitable material, such as aluminum oxide ($Al_2O_3$), boron nitride (BN), quartz, titanium (Ti), and the like. The material can be a highly refractory material. The crucible 130 has good heat conductivity, and can effectively and uniformly radiate heat to the deposition material 120.

The contact parts 210 of the band 200 contact a lower side of the crucible 130, and the rest of the band 200 is spaced apart from the lower side of the crucible 130. The crucible 130 can be inserted into, and/or removed from, the band 200.

The contact parts 210 are formed from a bent portion of the band 200. The contact parts 210 can be, for example, trapezoidal, semi-circular, triangular, or rectangular. The contact parts 210 can be divided by cuts formed in the band 200. The contact parts are generally flexible, so as to be readily coupled to the crucible 130.

Therefore, it is possible to precisely determine the temperature of the deposition material, by detecting the temperature of the heater and the temperature of the crucible 130. This dual detection process is more accurate than a conventional non-contact type thermocouple detection process.

The contact parts 210 provide for a more precise and repeatable coupling of the band 200 to the crucible 130, as compared with a conventional point-contact type thermocouple. Therefore, even when the crucible 130 is attached, or detached, from the crucible heating apparatus 100, to perform maintenance on the crucible 100, or to exchange the deposition material, it is possible to consistently position the crucible 130 in the band 200, and the thermocouple 310 can remain attached to the band 200, thereby improving the accuracy and/or precision of temperature measurements.

The band 200 may be formed of the same material as the contact parts 210. For example, the band may be formed of steel use stainless (SUS).

The heater 410 can be a coiled heating wire, but is not limited thereto, as the heater 410 can be any suitable heating device. The heater 410 surrounds the crucible 130, and does not directly heat the thermocouple 310. The thermocouple 310 can be insulated from the heater 210, by the housing 400, for example. More specifically, the heater 410 surrounds the entire crucible 130, to uniformly heat the crucible 130, thereby improving the evaporation speed and uniformity of deposition, of the deposition material 120.

The housing 400 houses the crucible 130, the band 200, and the heater 410. The housing 400 protects and supports the above components.

The temperature controller 300 is connected to another terminal of the thermocouple 310. The temperature controller 300 controls the heater 410, according to the temperature of the deposition material 120, thereby controlling the temperature of the deposition material 120.

The thermocouple 310 may be connected to a lower part of the band 200, to precisely measure the temperature of the deposition material 120, without thermal interference from the heater 410. The use of the thermocouple 310 is based on the theory that when both terminals of different conductive metals are electrically connected to each other, current flows according to a temperature difference between the terminals. Therefore, it is possible to determine the temperature of the deposition material 120, by detecting the temperature of the crucible 130, through the use of the thermocouple 310, which is connected to the band 200.

Figure 3:
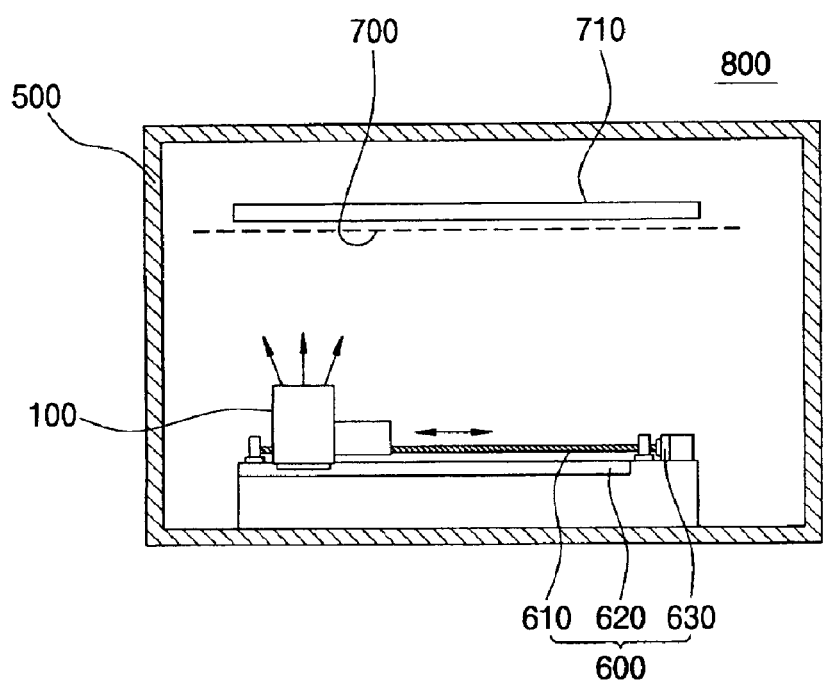
FIG. 3 is a cross-sectional view of a deposition apparatus with the crucible heating apparatus, in accordance with an exemplary embodiment of the present invention.

FIG. 3 is a cross-sectional view of a deposition apparatus 800 including the crucible heating apparatus 100, in accordance with an exemplary embodiment of the present invention. Referring to FIG. 3, the deposition apparatus 800 includes: a chamber 500, the crucible heating apparatus 100, which is disposed in the chamber 500, a pattern mask 700 disposed over the crucible heating apparatus 100, to pattern a deposition material emitted from the crucible 100, and a substrate 710 disposed on the pattern mask 700, upon which the patterned deposition material is deposited.

Air can be evacuated from the chamber 500, by a pump (not shown). The generated vacuum in the chamber facilitates the deposition of the deposition material onto the substrate 710. The crucible heating apparatus 100 heats the deposition material 120, to evaporate the deposition material 120.

The deposition apparatus 800 includes a conveyance unit 600 to move the crucible heating apparatus 100 across the substrate 710, such that the entire substrate 710 can be uniformly coated with a thin film. The conveyance unit 600 can move the crucible heating apparatus 100 at various speeds, according to particular processing conditions. The conveyance unit 600 includes a screw 610, a motor 630 to rotate the screw 610, and a guide 620 to guide the crucible heating apparatus 100 along the screw 610. The screw 610 can be, for example, a ball screw.

The pattern mask 700 is disposed between the crucible heating apparatus 100 and the substrate 710, to pattern the deposition material on the substrate 710. The pattern mask 700 is formed of a strong metal material, so as to have a small thickness. Therefore, it is possible to suppress bending of the pattern mask 700, and prevent irregular deposition, due to a shadow phenomenon.

The substrate 710 is disposed on the pattern mask 700, such that a predetermined pattern of thin film is deposited on the substrate 710, according to the plurality of pattern parts of the pattern mask 700. Pixel electrodes, and organic layers, such as a hole transport layer, an organic emission layer, an electron transport layer, and so on, are sequentially formed on the substrate 710, thereby forming an OLED (not shown), which has an opposite electrode on the organic layers.

As can be seen from the foregoing, a crucible heating apparatus in a deposition apparatus, in accordance with an exemplary embodiment of the present invention, can be adapted to readily deposit an organic layer of an OLED, and may also be adapted to various thin film deposition technologies, including flat panel displays. However, the present invention is not limited thereto. The crucible heating apparatus and the deposition apparatus provide improved temperature reproduction and temperature accuracy, to perform improved thin film deposition operations.

Although a few exemplary embodiments of the present invention have been shown and described, it would be appreciated by those skilled in the art that changes may be made in these embodiments, without departing from the principles and spirit of the invention, the scope of which is defined in the claims and their equivalents.

What is claimed is:

1. A crucible heating apparatus comprising:
   a crucible comprising,
      a main body to house a deposition material, and
      a cover disposed on the main body, having a nozzle;
   a band to insertingly couple with a lower side of a side surface of the crucible, having flexible contact parts to contact the lower side of a side surface of the crucible;
   a thermocouple having a first terminal that is connected to the band;
   a housing to house the crucible and the band, having an opening; and
   a heater disposed inside the housing, to heat the deposition material.

2. The crucible heating apparatus according to claim 1, wherein the thermocouple is connected to a part of the band that is adjacent to the bottom of the housing.

3. The crucible heating apparatus according to claim 1, further comprising a temperature controller connected to a second terminal of the thermocouple.

4. The crucible heating apparatus according to claim 1, wherein the band and the contact parts are formed of the same material.

5. The crucible heating apparatus according to claim 1, wherein the band and the contact parts are formed of steel use stainless (SUS).

6. The crucible heating apparatus according to claim 1, wherein the contact parts are bent from an upper part of the band.

7. The crucible heating apparatus according to claim 1, wherein the heater surrounds the crucible.

8. The crucible heating apparatus according to claim 1, wherein the thermocouple is insulated from the heater.

9. A deposition apparatus comprising:
   a chamber;
   a pattern mask disposed in an upper part of the chamber; and
   a crucible heating apparatus comprising,
      a crucible comprising a main body to house a deposition material, and a cover disposed on the main body, having a nozzle,
      a band to insertingly couple with a lower side of a side surface of the crucible, having flexible contact parts that contact the lower side of a side surface of the crucible,
      a thermocouple having a first terminal connected to the band,
      a housing to house the crucible and the band, having an open upper part, and
      a heater disposed inside the housing, to heat the deposition material.

10. The deposition apparatus according to claim 9, wherein the thermocouple is connected to a part of the band that is adjacent to the bottom of the housing.

11. The deposition apparatus according to claim 9, further comprising a temperature controller connected to a second terminal of the thermocouple.

12. The deposition apparatus according to claim 9, wherein the band and the contact parts are formed of the same material.

13. The deposition apparatus according to claim 9, wherein the band and the contact parts are formed of steel use stainless (SUS).

14. The deposition apparatus according to claim 9, wherein the contact parts are bent from an upper part of the band.

15. The deposition apparatus according to claim 9, wherein the heater surrounds the crucible.

16. The deposition apparatus according to claim 9, wherein the thermocouple is insulated from the heater.

17. A heating apparatus to heat a crucible, comprising:
   a body;
   a band to insertingly couple with a lower side of a side surface of the crucible, having flexible contact parts that are bent to contact the lower side of a side surface of the crucible;
   a thermocouple having a first terminal that is connected to the band; and
   a heater disposed inside the body, to heat the crucible.

18. The heating apparatus of claim 17, wherein the contact parts are trapezoidal, semicircular, triangular, or rectangular.

19. The heating apparatus of claim 17, wherein the contact parts are divided by cuts formed in the band.

20. The heating apparatus of claim 17, further comprising a temperature controller connected to a second terminal of the thermocouple.

* * * * *